United States Patent [19]
Boehlke

[11] Patent Number: 5,576,652
[45] Date of Patent: Nov. 19, 1996

[54] DIGITAL PHASE SHIFTER

[75] Inventor: Kenneth A. Boehlke, Beaverton, Oreg.

[73] Assignee: Tektronix, Inc., Wilsonville, Oreg.

[21] Appl. No.: 544,570

[22] Filed: Oct. 18, 1995

Related U.S. Application Data

[63] Continuation of Ser. No. 262,119, Jun. 17, 1994, abandoned.
[51] Int. Cl.⁶ .................................................. H03H 11/16
[52] U.S. Cl. ........................... 327/254; 327/105; 327/175
[58] Field of Search ..................................... 327/237, 238, 327/241, 242, 152, 175, 176, 254, 255, 239, 250, 105, 116

[56] References Cited

U.S. PATENT DOCUMENTS

| | | | |
|---|---|---|---|
| 4,297,641 | 10/1981 | Sterzer | 327/237 |
| 4,799,022 | 1/1989 | Skierszkan | 327/116 |
| 5,122,757 | 6/1992 | Weber et al. | 327/105 |
| 5,317,288 | 5/1994 | Yung et al. | 327/238 |

Primary Examiner—Timothy P. Callahan
Assistant Examiner—Jung Ho Kim
Attorney, Agent, or Firm—Francis I. Gray

[57] ABSTRACT

A digital phase shifter produces from an input clock signal quadrature pairs of the input clock signal. The quadrature pairs are mixed and summed in response to a desired phase angle control signal to produce a phase shifted clock signal. The quadrature pairs are produced from a counter having as input a signal at four times the input clock signal frequency, with one output being a signal at the input clock signal frequency. The clock output signal is delayed one-quarter of a cycle to form a quadrature clock output signal, and the in-phase and quadrature clock output signals are converted to complementary quadrature signals. The complementary quadrature signals are input to a double 4:1 multiplexer so as to produce for any selection signal a quadrature pair of signals at the output defining one of four quadrants. The selected quadrature pair is mixed in a 2:1 multiplexer by a selection signal that alternates between states as a function of the comparison between the most significant bits from the counter and a fine angle control signal. The output from the multiplexer is bandpass filtered at the input clock frequency to produce the phase shifted clock signal.

14 Claims, 2 Drawing Sheets

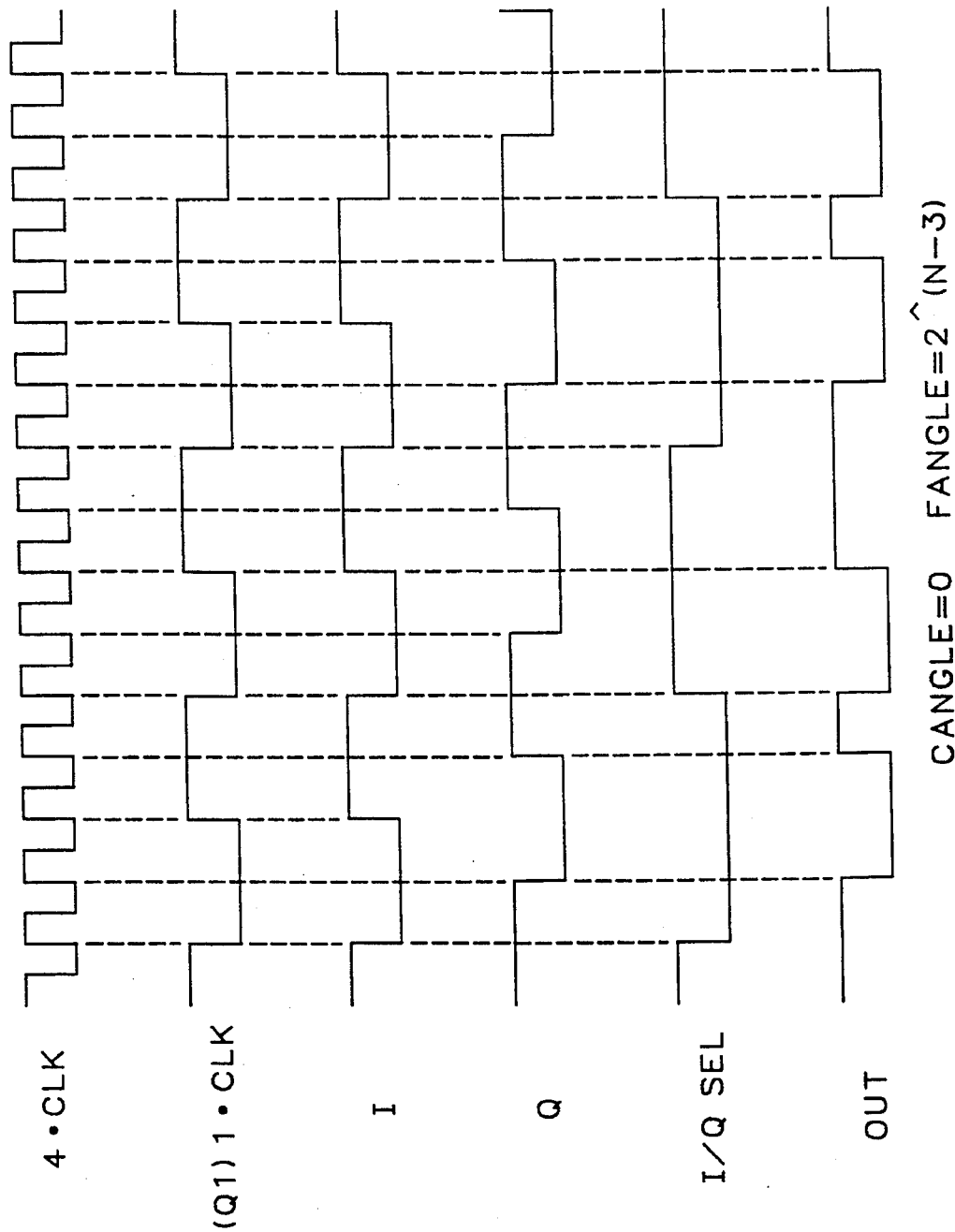

DIGITAL PHASE SHIFTER

This is a continuation of application Ser. No. 08/262,119, filed Jun. 17, 1994, and now abandoned.

BACKGROUND OF THE INVENTION

The present invention relates to shifting the phase of a signal, and more particularly to a digital phase shifter for shifting the phase of a clock signal by a programmable number of degrees.

A typical method of shifting the phase of a signal is to use a phase-locked loop (PLL) with a variable phase shifter. The signal, such as a clock signal, is input to a phase detector where it is compared with the output of a VCO. The difference in phase is converted to a control voltage that is used to control the phase of the VCO. The variable phase shifter is inserted in the feedback loop between the output of the VCO and the input to the phase detector so that the signal output from the VCO has the desired phase relationship to the signal input to the PLL. Other analog techniques use tapped delay lines, with the taps coupled to a multiplexer to select the appropriate tap for output as the phase shifted signal.

A prior digital method of shifting the phase of a signal uses a heterodyne concept, as disclosed in U.S. Pat. No. 4,677,395 issued Jun. 30, 1987 to Daniel G. Baker entitled "Digital Phase Shifter", incorporated herein by reference. A continuous wave (cw) signal is mixed with a VCO signal which is an integer multiple of a difference frequency. The difference frequency is phase-locked and the VCO signal is divided into N increments by a counter. The count is compared with a desired phase shift value that is added to the difference frequency. The phase shifted difference frequency is then converted up to produce the phase shifted cw signal.

What is desired is a digital phase shifter that is more accurate than the prior analog phase shifters while avoiding the complexity of the digital heterodyne technique.

SUMMARY OF THE INVENTION

Accordingly the present invention provides a digital phase shifter that generates quadrature components from an input clock signal and selectively combines the quadrature components to produce an output phase shifted clock signal having a desired phase shift relative to the input clock signal. The input clock signal is input to a phase-locked loop or multiplier to produce a clock signal at four times the desired frequency. The clock signal is input to a counter that produces two quadrature clock signals at the desired frequency. The quadrature clock signals and their inverted versions are input to a first multiplexer to produce a pair of output signals, the output signals being selected by a coarse control signal that determines in which quadrant between 0 and 360 degrees the desired phase shift is. The remaining most significant bits from the counter are compared with a fine control angle value to generate a fine control signal for a second multiplexer to which the pair of output signals is applied. The second multiplexer and fine control signal act as a mixer for the pair of output signals to generate the output phase shifted clock signal.

The objects, advantages and other novel features of the present invention are apparent from the following detailed description when read in conjunction with the appended claims and attached drawing.

BRIEF DESCRIPTION OF THE DRAWING

FIG. 2 is a timing diagram view for the digital phase shifter of FIG. 1.

DESCRIPTION OF THE PREFERRED EMBODIMENT

Figure 1:
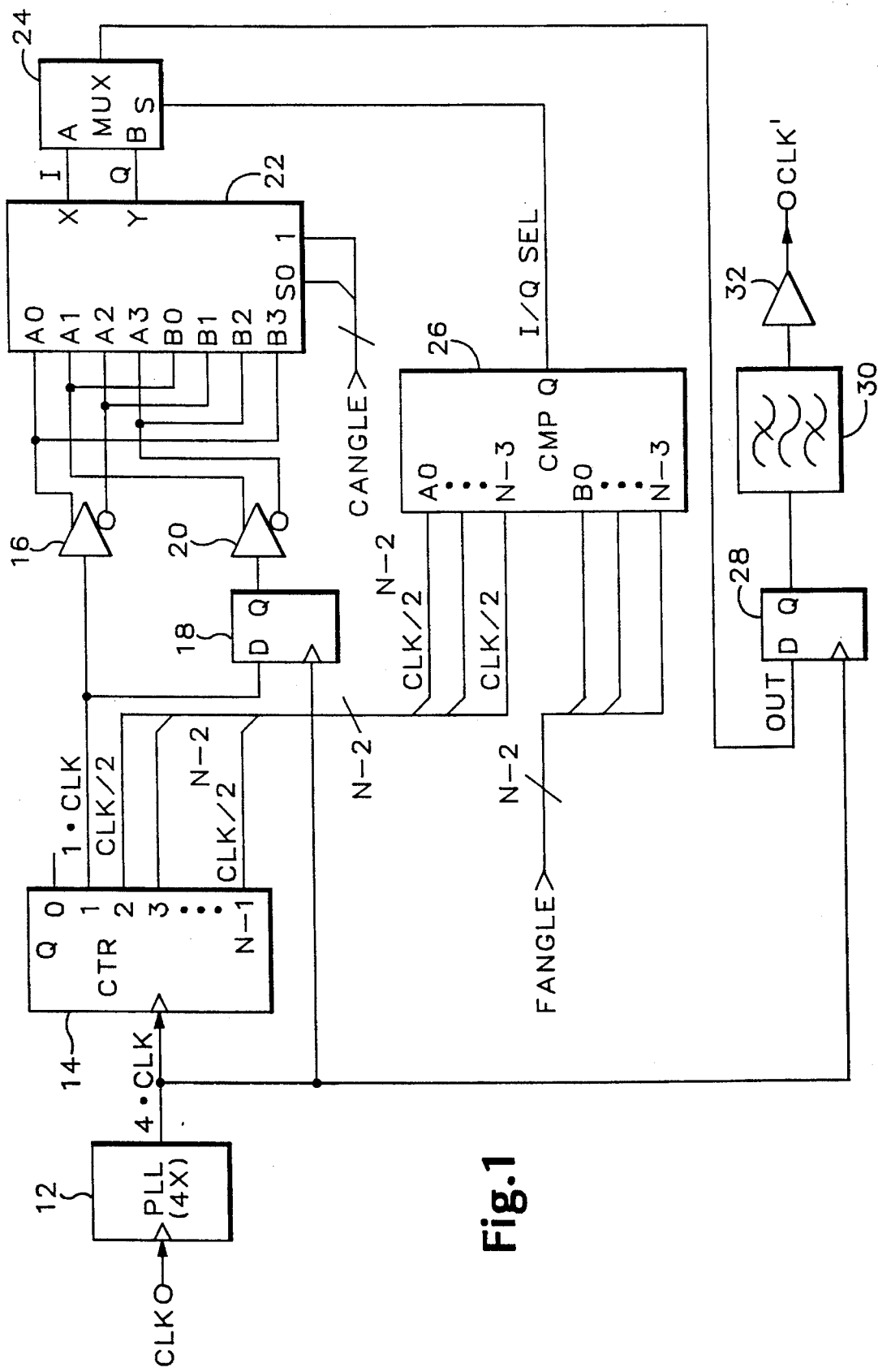
FIG. 1 is a block/schematic diagram view for a digital phase shifter according to the present invention.

Referring now to FIG. 1 an input clock signal CLK is input to a phase-locked loop (PLL) or multiplier 12 to produce a clock signal 4*CLK that has a frequency four times that of the input clock signal. 4*CLK is input to a continuous counter 14 having an N-bit output. The next to last least significant bit (lsb+1) Q1 output from the counter 14 provides a clock output signal 1*CLK having the same frequency as the input clock signal. 1*CLK is input to a first single-ended to complementary output gate 16 and to a D-type flip-flop 18 which is clocked by 4*CLK. The output from the flip-flop 18 is input to a second single-ended to complementary output gate 20. The outputs from the gates 16, 20 are pairs of complementary signals that are in quadrature with each other, i.e., the flip-flop 18 delays the one pair of signals by one-quarter of an input clock signal cycle (90 degrees phase shift). These outputs are input to two inputs of a first multiplexer 22 as four input signals, with the four signals for one input being shifted one position relative to the four signals for the other input. The first multiplexer 22 is a dual 4:1 multiplexer. A coarse control signal Cangle having two bits is input as the select signal for the first multiplexer 22. For example if Cangle is zero, then the two uninverted 1*CLK signals are output as quadrature signals I,Q, i.e., as a quadrature signal pair; if Cangle is one then the uninverted 1*CLK signal from the second gate 20 and the inverted 1*CLK signal from the first gate 16 are output as the quadrature signal pair; etc. Thus the first multiplexer 22 selects a ninety degree quadrant between 0 and 360 degrees within which the desired phase shift occurs.

The quadrature signal pair from the first multiplexer 22 is input to a second multiplexer 24 which acts as a 2:1 multiplexer. The most significant bits from the counter 14, i.e., bits lsb+2 (Q2) through the most significant bit (msb) (QN–1), are input to a digital comparator 26. Also input to the digital comparator 26 is a fine control signal Fangle. When the msbs from the counter 14 are equal to or exceed Fangle, then a select signal I/Q_SEL at the output has one of two states, otherwise the select signal has the other state. The select signal is applied to the second multiplexer 24 to provide at the output one of the two I,Q inputs. Since the counter 14 continuously counts the 4*CLK cycles, the I/Q_SEL signal alternates between states with a duty cycle determined by Fangle, except where Fangle is set to zero or maximum in which case one or the other of the two states is selected constantly. In this manner the quadrature signal pair is "mixed and summed" to form an output signal OUT representative of the desired phase shift between zero and 360 degrees. OUT is input to an output D-type flip-flop 28 which is clocked by 4*CLK to remove multiplexer switching transients to provide a clean signal, and the output from the flip-flop is input to a bandpass filter 30 having a nominal center frequency at the input clock signal frequency. The filtered clock signal from the filter 30 is input to a limiter/translator circuit 32 to bring the clock signal to appropriate logic levels and to remove output level variations. To ease filtering of the output from the flip-flop 28 the N–2 msbs of the counter 14 are scrambled before they are applied to the comparator 26. The scrambling is a reordering of the N–2 bits from "least to most significant" to "most to least significant", i.e., the most significant bit from the counter 14 is input to the least significant bit input of the comparator 26. This scrambling spreads out the spectrum of the output from the flip-flop 28, making it easier to filter by lowering the close in sidebands an approximate 20*log(N–2) decibels.

The total phase shift for the input clock signal may be defined by:

$$\text{PhaseShift(in degrees)}=90*\text{Cangle}+\text{Arctan}\{\text{Fangle}/(2^{(N-2)}-\text{Fangle})\}$$

or approximately by:

$$=90*\text{Cangle}+\text{Fangle}*90/2^{(N-2)}$$

The waveform level variations at the output of the filter 30 are caused by the summing of the I/Q signals, given by:

$$\text{RelAmp}=(\tfrac{1}{2}^{(N-2)})*\text{SQRT}\{2^{(2N-4)}-2^{(N-1)}*\text{Fangle}+2*\text{Fangle}^2\}$$

In operation as shown in FIG. 2 4*CLK, derived from the input clock signal by the PLL/multiplier 12, produces from the counter 14 the 1*CLK signal from the lsb+1 (Q1) output. For the given example where Cangle is zero and Fangle is $2^{(N-3)}$ the I,Q outputs from the first multiplexer 22 represent the first quadrant between zero and 90 degrees, i.e., I is a vector at zero degrees and Q is a vector at 90 degrees. The N–2 msbs from the counter 14 are input to the comparator 26 and compared with $2^{(N-3)}$, which is the msb for Fangle, i.e., the lsb from the counter CLK/2 due to scrambling is compared with the msb for Fangle so that for one in-phase cycle of I the I/Q_SEL signal is low, and for the next cycle it is high. The resulting OUT represents Q when IQ_SEL is low and represents I when I/Q_SEL is high. With equal amounts of I and Q the desired angle is 90*0+ 90*$2^{(N-3)}/2^{(N-2)}$=0+90/2=45 degrees.

Thus the present invention provides a digital phase shifter for a clock signal that provides an accuracy equal to $360/2^N$ degrees by generating quadrature components from the clock signal, and mixing the quadrature components according to a desired phase shift to produce a phase shifted clock signal.

What is claimed is:

1. A digital phase shifter comprising:

means for digitally generating from an input clock signal two sets of complementary clock signals, the clock signals of one set being in quadrature with the clock signals of the other set; and means, having the two sets of complementary clock signals input as quadrature pairs, for mixing the clock signals of a selected one of the quadrature pairs as a function of a desired phase shift to produce a phase shifted clock signal representing the input clock signal shifted in phase by the desired phase shift.

2. The digital phase shifter as recited in claim 1 wherein the digitally generating means comprises:

means for multiplying the frequency of the input clock signal to produce a multiple-times clock signal; and means for producing from the multiple-times clock signal the two sets of complementary clock signals.

3. The digital phase shifter as recited in claim 2 wherein the producing means comprises:

means for cyclically counting cycles of the multiple-times clock signal, the counting means having N outputs, one output of which provides a one-times clock signal at the frequency of the input clock signal;

means for deriving from the one-times clock signal a quadrature one-times clock signal; and means for generating from the one-times clock signal and the quadrature one-times clock signal the two sets of complementary clock signals.

4. The digital phase shifter as recited in claim 3 wherein the generating means comprises means for converting the one-times clock signal and the quadrature one-times clock signal into the two sets of complementary clock signals.

5. The digital phase shifter as recited in claim 3 wherein the mixing means comprises:

means for selecting from the input quadrature pairs in response to a coarse angle control signal the clock signals of the selected one of the quadrature pairs representing a selected quadrant of phase angles; and means for alternately selecting between the clock signals of the selected one of the quadrature pairs in response to a fine angle control signal to produce the phase shifted clock signal, the coarse and fine angle control signals representing the desired phase shift.

6. The digital phase shifter as recited in claim 5 wherein the alternatingly selecting means comprises:

means for comparing the outputs from the counting means having frequencies less than the frequency of the one-times clock signal with the fine angle control signal to generate a select control signal; and means for producing the phase shifted clock signal from the selected one of the quadrature pairs in response to the select control signal.

7. A method of digital phase shifting comprising the steps of:

digitally generating from an input clock signal two sets of complementary clock signals, the clock signals of one set being in quadrature with the clock signals of the other set;

combining the two sets of complementary clock signals to form quadrature pairs of the clock signals from the two sets of complementary clock signals; and mixing the clock signals of a selected one of the quadrature pairs as a function of a desired phase shift to produce a phase shifted clock signal representing the input clock signal shifted in phase by the desired phase shift.

8. The method as recited in claim 7 wherein the digitally generating step comprises the steps of:

multiplying the frequency of the input clock signal to produce a multiple-times clock signal; and producing from the multiple-times clock signal the two sets of complementary clock signals.

9. The method as recited in claim 8 wherein the producing step comprises the steps of:

cyclically counting cycles of the multiple-times clock signal, the counting step having N outputs, one output of which provides a one-times clock signal at the frequency of the input clock signal;

deriving from the one-times clock signal a quadrature one-times clock signal; and generating from the one-times clock signal and the quadrature one-times clock signal the two sets of complementary clock signals.

10. The method as recited in claim 9 wherein the generating step comprises the step of converting the one-times clock signal and the quadrature one-times clock signal into the two sets of complementary clock signals.

11. The method as recited in claim 9 wherein the mixing step comprises the steps of:

selecting from the input quadrature pairs in response to a coarse angle control signal the clock signals of the selected one of the quadrature pairs representing a selected quadrant of phase angles; and alternatingly selecting between the clock signals of the selected one of the quadrature pairs in response to a fine angle control signal to produce the phase shifted clock signal, the coarse and fine angle control signals representing the desired phase shift.

12. The digital phase shifter as recited in claim 11 wherein the alternatingly selecting step comprises the steps of:

comparing the outputs from the counting step having frequencies less than the frequency of the one-times clock signal with the fine angle control signal to generate a select control signal; and producing the phase shifted clock signal from the selected one of the quadrature pairs in response to the select control signal.

13. The digital phase shifter as recited in claim 1 wherein the mixing means comprises:

means for selecting from the input quadrature pairs in response to a coarse angle control signal the selected one of the quadrature pairs representing a selected quadrant of phase angles; and means for alternatingly selecting between the clock signals of the selected one of the quadrature pairs in response to a fine angle control signal to produce the phase shifted clock signal, the coarse and fine angle control signals representing the desired phase shift.

14. The method as recited in claim 7 wherein the mixing step comprises the steps of:

selecting from the input quadrature pairs in response to a coarse angle control signal the selected one of the quadrature pairs representing a selected quadrant of phase angles; and alternatingly selecting between the clock signals of the selected one of the quadrature pairs in response to a fine angle control signal to produce the phase shifted clock signal, the coarse and fine angle control signals representing the desired phase shift.

\* \* \* \* \*